(12) United States Patent
Saxler

(10) Patent No.: US 7,135,715 B2
(45) Date of Patent: Nov. 14, 2006

(54) CO-DOPING FOR FERMI LEVEL CONTROL IN SEMI-INSULATING GROUP III NITRIDES

(75) Inventor: Adam William Saxler, Durham, NC (US)

(73) Assignee: Cree, Inc., Durham, NC (US)

( * ) Notice: Subject to any disclaimer, the term of this patent is extended or adjusted under 35 U.S.C. 154(b) by 55 days.

(21) Appl. No.: 10/752,970

(22) Filed: Jan. 7, 2004

(65) Prior Publication Data

US 2005/0145874 A1    Jul. 7, 2005

(51) Int. Cl.
H01L 29/24    (2006.01)
(52) U.S. Cl. ............... 257/103; 257/101; 257/E21.111; 257/E21.121
(58) Field of Classification Search ............... 257/103, 257/101, 102, 12; 438/22, 46, 89
See application file for complete search history.

(56) References Cited

U.S. PATENT DOCUMENTS

| 4,481,523 | A | * | 11/1984 | Osaka et al. ............... 257/186 |
| 4,946,547 | A |   | 8/1990 | Palmour et al. ............ 156/643 |
| 5,200,022 | A |   | 4/1993 | Kong et al. ................. 156/612 |
| 5,210,051 | A |   | 5/1993 | Carter, Jr. ................... 437/107 |
| 5,292,501 | A |   | 3/1994 | Degenhardt et al. ......... 424/49 |
| RE34,861 | E |   | 2/1995 | Davis et al. ................ 437/100 |
| 5,393,993 | A |   | 2/1995 | Edmond et al. ............. 257/77 |
| 5,523,589 | A |   | 6/1996 | Edmond et al. ............. 257/77 |
| 5,592,501 | A |   | 1/1997 | Edmond et al. ............. 372/45 |
| 6,156,581 | A | * | 12/2000 | Vaudo et al. ................ 438/22 |
| 6,218,680 | B1 |  | 4/2001 | Carter, Jr. et al. ........... 257/77 |
| 6,596,079 | B1 | * | 7/2003 | Vaudo et al. ................ 117/97 |
| 2001/0008656 | A1 |  | 7/2001 | Tischler et al. |
| 2001/0015437 | A1 |  | 8/2001 | Ishii et al. |

FOREIGN PATENT DOCUMENTS

WO    WO 88/04830 A    6/1988

OTHER PUBLICATIONS

Armitage et al "Contributions from Gallium Vacancies and Carbon-Related Defects to the "Yellow Luminescence" in GaN" *Applied Physics Letters* 82(20):3457-3459 (2003).
Heikman et al "Growth of Fe Doped Semi-Insulating GaN by Metalorganic Chemical Vapor Deposition" *Applied Physics Letters* 81(3):439-441 (2002).
International Search Report and Written Opinion of International Application Serial No. PCT/US2004/031982 mailed on Mar. 10, 2005.

(Continued)

*Primary Examiner*—Andy Huynh
*Assistant Examiner*—Thinh T Nguyen
(74) *Attorney, Agent, or Firm*—Myers Bigel Sibley & Sajovec, P.A.

(57) ABSTRACT

Semi-insulating Group III nitride layers and methods of fabricating semi-insulating Group III nitride layers include doping a Group III nitride layer with a shallow level p-type dopant and doping the Group III nitride layer with a deep level dopant, such as a deep level transition metal dopant. Such layers and/or method may also include doping a Group III nitride layer with a shallow level dopant having a concentration of less than about $1 \times 10^{17}$ cm$^{-3}$ and doping the Group III nitride layer with a deep level transition metal dopant. The concentration of the deep level transition metal dopant is greater than a concentration of the shallow level p-type dopant.

18 Claims, 3 Drawing Sheets

OTHER PUBLICATIONS

Korotkov et al "Optical Study of GaN: Mn-co-doped with Mg Grown by Metal Organic Vapor Phase Epitaxy" *Physica B* 308-310: 18-21.

Li et al "Surface Polarity Dependence of Mg Doping in GaN Grown by Molecular-Beam Epitaxy" *Applied Physics Letters* 76(13):1740-1742 (2000).

Ringel et al "Detection of Carbon-Related Bandgap States in GaN Using Deep Level Optical Spectroscopy" *IEEE International Symposium on Compound Semiconductors* 4-5 (2003).

Seager et al "Role of Carbon in GaN" *Journal of Applied Physics* 92(11):6553-6560 (2002).

Witte et al "Deep Defects in Fe-Doped GaN Layers Analysed by Electrical and Photoelectrical Spectroscopic Methods" *Mat. Res. Soc. Symp. Proc.* 798:575-580 (2003).

B. Streetman, *Solid State Electronic Devices*, 2$^{nd}$ Ed. 1980, pp. 79-81, 127, and 183-185.

Heikman et al. "Growth and characteristics of Fe-doped GaN," *Journal of Crystal Growth*, vol. 248, Feb. 2003, pp. 513-517.

Heikman et al. "Growth of Fe-doped semi-insulating GaN by metalorganic chemical vapor deposition," *Applied Physics Letters*, vol. 81, No. 3, Jul. 15, 2002, pp. 439-441.

Kim et al. "Improvement of magnetic property of GaMnN by codoping of Mg," *Journal of Applied Physics*, vol. 93, No. 10, May 15, 2003, pp. 6793-6795.

Polyakov et al. "Electrical and optical properties of Cr and Fe implanted n-GaN," *Journal of Applied Physics*, vol. 93, No. 9, May 1, 2003, pp. 5388-5396.

Tang et al. "Properties of carbon-doped GaN," *Applied Physics Letters*, vol. 78, No. 6, Feb. 5, 2001, pp. 757-759.

Jenny et al. "Deep level transient spectroscopic and Hall effect investigation of the position of the vanadium acceptor level in 4H and 6H SiC," *Applied Physics Letters*, vol. 68, No. 14, Apr. 1, 1996, pp. 1963-1965.

Jenny et al. "On the compensation mechanism in high-resistivity 6H-SiC doped with vanadium," *Journal of Applied Physics*, vol. 78, No. 6, Sep. 15, 1995, pp. 3839-3842.

\* cited by examiner

US 7,135,715 B2

CO-DOPING FOR FERMI LEVEL CONTROL IN SEMI-INSULATING GROUP III NITRIDES

FIELD OF THE INVENTION

The present invention relates to semiconductor materials and, more particularly, to semi-insulating Group III nitride semiconductor layers.

BACKGROUND

Materials such as silicon (Si) and gallium arsenide (GaAs) have found wide application in semiconductor devices for lower power and (in the case of Si) lower frequency applications. These, more familiar, semiconductor materials may not be well suited for higher power and/or high frequency applications, however, because of their relatively small bandgaps (e.g., 1.12 eV for Si and 1.42 for GaAs at room temperature) and/or relatively small breakdown voltages.

In light of the difficulties presented by Si and GaAs, interest in high power, high temperature and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials, typically, have higher electric field breakdown strengths and higher electron saturation velocities as compared to gallium arsenide and silicon.

In fabricating high power and/or high frequency devices from Group III nitrides, it may be beneficial to fabricate these devices on a semi-insulating Group III nitride layer, such as a semi-insulating GaN and/or AlInGaN layer. Insulating GaN layers have been fabricated by carefully controlling the deposition conditions of undoped GaN. Insulating GaN layers have also been fabricated by doping the GaN layers with Fe or C. While such techniques may produce a semi-insulating Group III nitride layer, variations between production runs may result in differing insulating characteristics of the resulting layers.

SUMMARY OF THE INVENTION

Embodiments of the present invention provide semi-insulating Group III nitride semiconductor layers and methods of fabricating semi-insulating Group III nitride layers. In certain embodiments of the present invention, fabrication of a semi-insulating Group III nitride layer includes doping a Group III nitride layer with a shallow level p-type dopant and doping the Group III nitride layer with a deep level dopant. The concentration of the deep level dopant is greater than a concentration of the shallow level p-type dopant. In particular embodiments of the present invention, the deep level dopant is a deep level transition metal dopant. Additionally, the concentration of the shallow level dopant may be a net concentration.

In further embodiments of the present invention, the concentration of the shallow level p-type dopant is greater than a background concentration caused by defects and unintentional impurities in the Group III nitride layer. The concentration of the shallow level p-type dopant may be less than about $1 \times 10^{17}$ cm$^{-3}$. The shallow level p-type dopant may be Mg and/or Zn and/or other p-type dopants. The deep level transition metal dopant may be Fe, Co, Mn, Cr, V and/or Ni and/or other transition metal dopants. In particular embodiments of the present invention, the deep level transition metal dopant is Fe.

In additional embodiments of the present invention, a concentration of the shallow level p-type dopant is sufficient to cause a donor-like energy level of the deep level transition metal dopant to be a dominant energy level of the deep level transition metal dopant.

In yet other embodiments of the present invention, the concentration of the deep level transition metal dopant is at least about three times greater than the concentration of the shallow level p-type dopant. In particular embodiments of the present invention, the concentration of the deep level transition metal dopant is greater than about $2 \times 10^{17}$ cm$^{-3}$. In other embodiments of the present invention, the concentration of the deep level transition metal dopant may be about $2 \times 10$ cm$^{-3}$. Furthermore, doping with a shallow level p-type dopant and doping with a deep level transition metal may be carried out substantially simultaneously. For example, the Group III nitride layer may be grown utilizing chemical vapor deposition and doping with a shallow level p-type dopant and doping with a deep level transition metal may be carried out during the chemical vapor deposition.

In still further embodiments of the present invention, a semi-insulating Group III nitride layer is fabricated by doping a Group III nitride layer with a shallow level dopant having a concentration of less than about $1 \times 10^{17}$ cm$^{-3}$ and doping the Group III nitride layer with a deep level dopant, such as a deep level transition metal dopant. The concentration of the deep level dopant is greater than the concentration of the shallow level dopant. In particular embodiments of the present invention, the concentration of the deep level transition metal dopant is greater than about $2 \times 10^{17}$ cm$^{-3}$. In other embodiments of the present invention, the concentration of the deep level transition metal dopant is about $2 \times 10^{16}$ cm$^{-3}$. The concentration of the shallow level dopant may be greater than a background concentration caused by defects and unintentional impurities in the Group III nitride layer. The concentration of the shallow level dopant may be a net concentration.

In particular embodiments of the present invention, the shallow level dopant is an n-type dopant. The deep level transition metal dopant may be Fe, Co, Mn, Cr, V and/or Ni and/or other transition metal dopants. Furthermore, one of a p-type dopant and an n-type dopant may be selected as the shallow level dopant so as to, respectively, cause a donor-like energy level of the deep level transition metal dopant to be a dominant energy level of the deep level transition metal dopant or cause an acceptor-like energy level of the deep level transition metal dopant to be a dominant energy level of the deep level transition metal dopant.

In additional embodiments of the present invention, a semi-insulating semiconductor material layer is provided by a Group III nitride layer including a shallow level p-type dopant and a deep level dopant, such as a deep level transition metal dopant. A concentration of the deep level transition metal dopant is greater than a concentration of the shallow level p-type dopant. The concentration of the shallow level p-type dopant may be greater than a background concentration caused by defects and unintentional impurities in the Group III nitride layer. The concentration of the shallow level p-type dopant may be less than about $1 \times 10^{17}$ cm$^{-3}$. The shallow level p-type dopant may be Mg and/or Zn and/or other p-type dopants. The deep level transition metal dopant may be Fe, Co, Mn, Cr, V and/or Ni and/or other transition metal dopants. Furthermore, a donor-like energy level of the deep level transition metal dopant may be a dominant energy level of the deep level transition metal dopant. In further embodiments of the present invention, the concentration of the deep level transition metal dopant is at least about three times greater than the concentration of the shallow level p-type dopant. In particular embodiments of the present invention, the concentration of the deep level transition metal dopant is greater than about $2\times10^{17}$ cm$^{-3}$. In other embodiments of the present invention, the concentration of the deep level transition metal dopant is about $2\times10^{16}$ cm$^{-3}$.

In still further embodiments of the present invention, a semi-insulating semiconductor material layer is provided by a Group III nitride layer including a shallow level dopant having a concentration of less than about $1\times10^{17}$ cm$^{-3}$ and a deep level dopant, such as a deep level transition metal dopant. The concentration of the deep level transition metal dopant is greater than the concentration of the shallow level dopant. The concentration of the shallow level dopant may be greater than a background concentration caused by defects and unintentional impurities in the Group III nitride layer. The shallow level dopant may be an n-type dopant. The deep level transition metal dopant may be Fe, Co, Mn, Cr, V and/or Ni and/or other transition metal dopants. If the shallow level dopant is an n-type dopant, an acceptor-like energy level of the deep level transition metal dopant may be a dominant energy level of the deep level transition metal dopant. The concentration of the deep level transition metal dopant may be at least about three times greater than the concentration of the shallow level dopant. In particular embodiments of the present invention, the concentration of the deep level transition metal dopant is greater than about $2\times10^{17}$ cm$^{-3}$. In other embodiments of the present invention, the concentration of the deep level transition metal dopant is about $2\times10^{16}$ cm$^{-3}$.

DETAILED DESCRIPTION OF EMBODIMENTS OF THE INVENTION

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. As will also be appreciated by those of skill in the art, references herein to a layer formed "on" a substrate or other layer may refer to the layer formed directly on the substrate or other layer or on an intervening layer or layers formed on the substrate or other layer. As used herein the term "and/or" includes any and all combinations of one or more of the associated listed items.

Embodiments of the present invention may utilize co-doping of a Group III nitride layer with a shallow level dopant and a deep level dopant to provide a predictable characteristic of a semi-insulating Group III nitride layer. The term "semi-insulating" is used descriptively in a relative sense rather than in an absolute sense. In particular embodiments of the present invention, the semi-insulating Group III nitride layer has a resistivity equal to or higher than about $1\times10^5$ Ω-cm at room temperature.

Embodiments of the present invention may be particularly well suited for use in nitride-based devices such as Group III-nitride based devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

Figure 1:
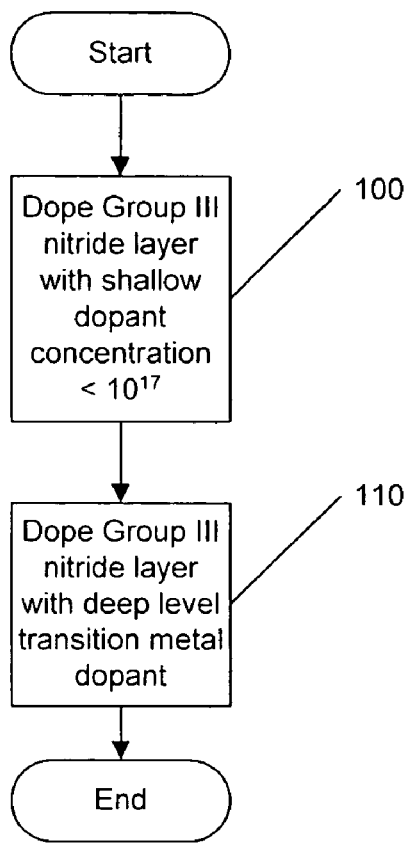
FIG. 1 is a flowchart illustrating operations for fabricating a semi-insulating Group III nitride layer according to embodiments of the present invention.

Fabrication of materials according to embodiments of the present invention is illustrated in the flow chart of FIG. 1. As seen in FIG. 1, a Group III nitride layer is doped with a shallow level dopant at a concentration of less than about $1\times10^{17}$ cm$^{-3}$ (block 100). The shallow level dopant may be an n-type dopant or a p-type dopant. For example, the shallow level dopant may be Si, Ge, O, Mg or Zn and/or other p-type or n-type dopants. As used herein, a shallow level dopant refers to a dopant that has an acceptor/donor energy level that is closer to the conduction or valence bands of the Group III nitride layer than the intended dominant level of the intentionally introduced deep level dopant. In particular embodiments of the present invention, the acceptor/donor energy level of the shallow level dopant is within about 0.3 eV of the conduction or valence band of the Group III nitride layer.

The Group III nitride layer is doped with a deep level dopant, such as a transition metal, so as to make the Group III nitride layer semi-insulating (block 110). The deep level transition metal dopant may, for example, be Fe, Co, Mn, Cr, V and/or Ni and/or other transition metal dopants. Other deep level dopants could also be utilized, for example, C or a carbon complex. In particular embodiments of the present invention, the deep level transition metal dopant is Fe. As used herein, a deep level dopant refers to a dopant that has a large enough energy from the conduction or valence band so that at operating temperature, a very small number of free carriers would be in the conduction or valence bands. For example, a dopant that had an energy level that was greater than about 0.5 eV from the conduction band and contributed much less than $10^{14}$ cm$^{-3}$ free carriers could be considered a deep level dopant.

Providing shallow level dopant concentrations of less than about $1\times10^{17}$ cm$^{-3}$ may allow for production of a semi-insulating layer with lower concentrations of deep level dopants than may be needed with shallow level dopant concentrations of greater than about $1\times10^{17}$ cm$^{-3}$. Higher concentrations of deep level dopant may be undesirable in certain circumstances. For example, high concentrations of Fe may increase trapping in comparison to lower concentrations of Fe. Thus, it may be advantageous to provide a semi-insulating Group III nitride with lower concentrations of Fe.

Figure 2:
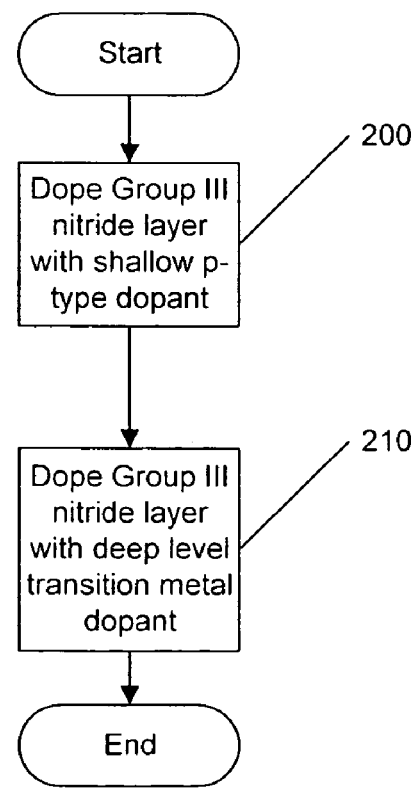
FIG. 2 is a flowchart illustrating operations for fabricating a semi-insulating Group III nitride layer according to further embodiments of the present invention.

FIG. 2 illustrates further embodiments of the present invention. As seen in FIG. 2, a Group III nitride layer is doped with a shallow level p-type dopant (block 200). For example, the shallow level p-type dopant may be Mg or Zn and/or other p-type dopants. The Group III nitride layer is also doped with a deep level dopant, such as a transition metal, so as to make the Group III nitride layer semi-insulating (block 210). The deep level transition metal dopant may, for example, be Fe, Co, Mn, Cr, V and/or Ni. Other deep level dopants could also be utilized, for example, C or a carbon complex. In particular embodiments of the present invention, the deep level transition metal dopant is Fe.

Combinations of FIGS. 1 and 2 may also be provided where a shallow level p-type dopant having a concentration of less than about $1 \times 10^{17}$ cm$^{-3}$ is provided.

In the fabrication of a semi-insulating Group III nitride as illustrated in FIGS. 1 and 2, the concentration of the deep level dopant is greater than a concentration of the shallow level dopant. In particular embodiments of the present invention, the concentration of the deep level dopant is greater than the net concentration of the shallow level dopant. As used herein, the term net concentration refers to the effective concentration of the shallow level dopant. In certain embodiments of the present invention, the concentration of the deep level transition metal dopant is at least about three times the concentration of the shallow level dopant. The particular concentration level of the deep level dopant may depend on the device and/or the use of the device to be fabricated with the semi-insulating Group III nitride layer. In particular embodiments of the present invention, the deep level transition metal dopant may have a concentration of greater than about $2 \times 10^{17}$ cm$^{-3}$. Such a concentration may, for example, provide higher breakdown voltages in power devices fabricated with the semi-insulating layer. In other embodiments of the present invention, the deep level transition metal dopant may have a concentration of about $2 \times 10^{16}$ cm$^{-3}$. Such a concentration may, for example, provide higher power densities in power devices fabricated with the semi-insulating layer.

Furthermore, the concentration of the shallow level dopant should be greater than the background concentration caused by defects and unintentional impurities. In particular embodiments of the present invention, the concentration of the shallow level dopant is sufficiently great such that the position of the Fermi level of the material is controlled by the shallow level dopant in the absence of the deep level dopant. However, the deep level dopant concentration is higher than that of the shallow level dopant, so the Fermi level of the material is pinned at a level associated with the deep level dopant.

Figure 3:
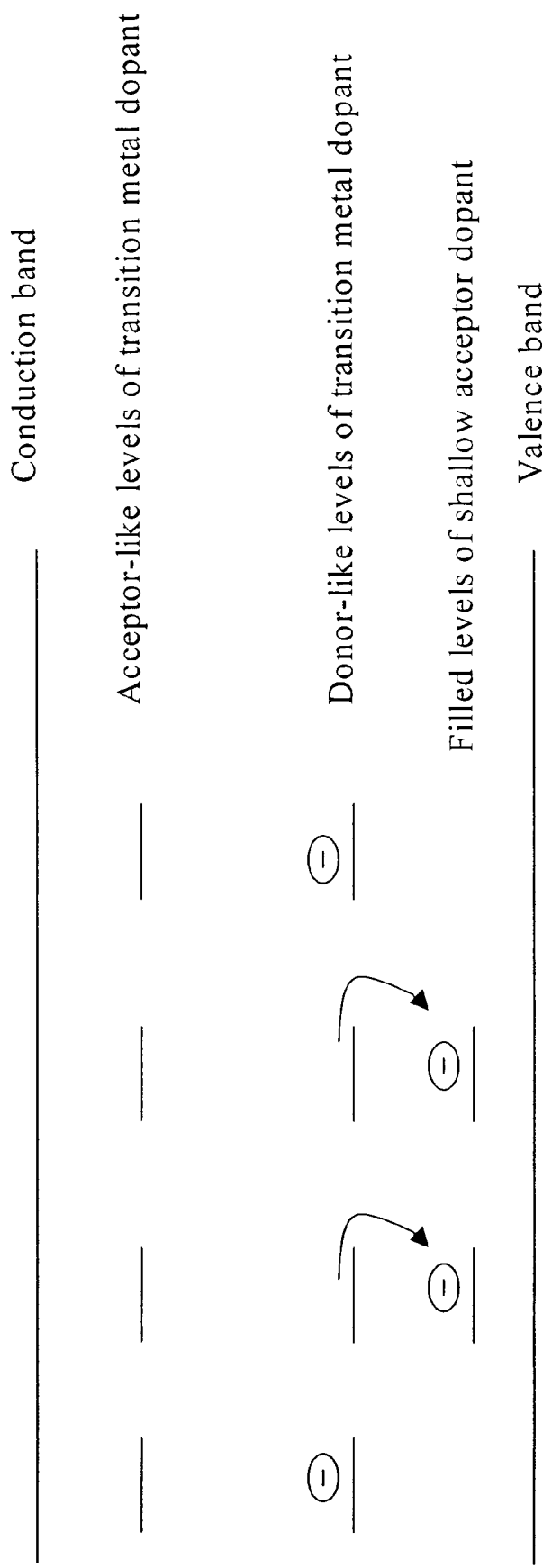
FIG. 3 is a band diagram illustrating co-doping with a shallow acceptor to pin the Fermi level at a donor-like level of transition metal dopant.
Figure 4:
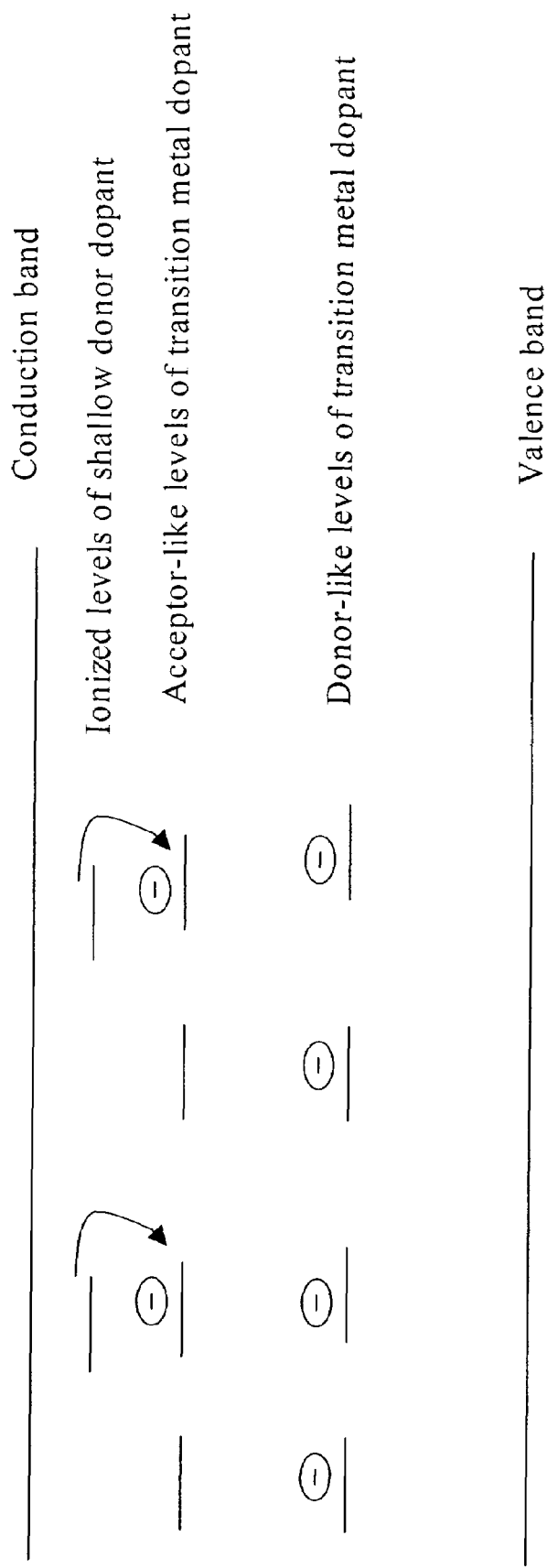
FIG. 4 is a band diagram illustrating co-doping with a shallow donor to pin the Fermi level at an acceptor-like level of transition metal dopant.

Depending on whether the shallow level dopant is p-type or n-type, a different character and energy level of the deep level dopant may be expressed. The resistivity and trapping characteristics of the layer may be affected by whether the shallow level dopant is p-type or n-type. Such may be the case, for example, if the deep level dopant has two energy levels where one energy level is donor-like and another is acceptor-like. Thus, for example, if the shallow level dopant is p-type, the dominant energy level of the deep level dopant may be donor-like. Such a case is illustrated in the band diagram of FIG. 3. If the shallow level dopant is n-type, the dominant energy level of the deep level dopant may be acceptor-like. Such a case is illustrated in the band diagram of FIG. 4. Thus, by selection of the shallow level dopant, the characteristics of the energy level of the co-doped layer may be controlled to be either acceptor-like or donor-like. As used herein, acceptor-like refers to having an additional electron at a deep level acceptor energy level, where the additional electron would not be present without the co-dopant and donor-like refers to having fewer electrons at a deep level donor energy level, where the fewer electrons would be present without the co-dopant. Thus, by establishing the Fermi level of the layer based on a combination of the deep level dopant and the shallow level dopant, the characteristics of the resulting layer may be more readily reproducible and the variations between processing runs may be reduced, minimized and/or mitigated.

Additionally, the Group III nitride layer may be doped with the shallow and deep level dopants substantially simultaneously, for example, during formation of the Group III nitride layer, such as by chemical vapor deposition. Formation of the Group III nitride layer may be provided by MOCVD or by other techniques known to those of skill in the art, such as MBE, HVPE, solution growth and/or high pressure growth. The doping of the Group III nitride layer may be incorporated as part of the growth process and/or may be provided as a separate process, for example, by implantation after growth. For example, in particular embodiments of the present invention, the semi-insulating Group III nitride layer may be fabricated using MOCVD while flowing both Cp$_2$Fe and Cp$_2$Mg (for p-type dopant) or SiH$_4$ (for n-type dopant). Alternatively or additionally, DeZn, GeH$_4$, Si$_2$H$_6$, H$_2$O and/or O$_2$ may also be used as a dopant source. Other sources could also be used.

In certain embodiments of the present invention, the semi-insulating Group III nitride layer is formed on a substrate on which nitride based semi-insulating layer is formed may be a silicon carbide substrate and/or layer and/or a Group III nitride substrate and/or layer and/or a buffer layer. Furthermore, the semi-insulating Group III nitride layer may be provided as a substrate. Accordingly, the term layer includes layers and/or substrates. In particular embodiments of the present invention, the substrate on which the semi-insulating Group III nitride layer is formed may be a semi-insulating silicon carbide (SiC) substrate that may be, for example, 4H polytype of silicon carbide. Other silicon carbide candidate polytypes include the 3C, 6H, and 15R polytypes.

Silicon carbide has a much closer crystal lattice match to Group III nitrides than does sapphire (Al$_2$O$_3$), which is a very common substrate material for Group III nitride devices. The closer lattice match may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Appropriate SiC substrates are manufactured by, for example, Cree, Inc., of Durham, N.C., the assignee of the present invention, and methods for producing are described, for example, in U.S. Pat. Nos. Re. 34,861; U.S. Pat. Nos. 4,946,547; 5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,592,501, the contents of which are also incorporated herein by reference in their entirety.

Although silicon carbide and/or Group III nitrides may be used as a substrate material, embodiments of the present invention may utilize any suitable substrate, such as sapphire, aluminum nitride, silicon, GaAs, LGO, ZnO, LAO, InP and the like. In some embodiments, an appropriate buffer layer also may be formed.

The Group III nitride layer may also be annealed, for example, to remove native defects and impurities, such as hydrogen, that may result from the co-doping of the semi-insulating Group III nitride layer. For example, a post growth nitrogen anneal could be performed on the Group III nitride layer.

In the drawings and specification, there have been disclosed typical embodiments of the invention, and, although specific terms have been employed, they have been used in a generic and descriptive sense only and not for purposes of limitation.

That which is claimed is:

1. A semi-insulating semiconductor material layer, comprising a Group III nitride layer including a shallow level p-type dopant and a deep level dopant, wherein a concentration of the deep level dopant is greater than a concentration of the shallow level p-type dopant, and wherein the deep level dopant comprises a deep level transition metal dopant; and wherein the concentration of the deep level transition metal dopant is at least about three times greater than the concentration of the shallow level p-type dopant.

2. The semiconductor material layer of claim 1, wherein the concentration of the shallow level p-type dopant is greater than a background concentration caused by defects and unintentional impurities in the Group III nitride layer.

3. The semiconductor material layer of claim 1, wherein the concentration of the shallow level p-type dopant is less than about $1 \times 10^{17}$ cm$^{-3}$.

4. The semiconductor material layer of claim 1, wherein the shallow level p-type dopant comprises Mg and/or Zn.

5. The semiconductor material layer of claim 1, wherein the concentration of the shallow level dopant is a net concentration.

6. The semiconductor material layer of claim 1, wherein the deep level transition metal dopant comprises Fe, Co, Mn, Cr, V and/or Ni.

7. The semiconductor material layer of claim 1, wherein the deep level transition metal dopant comprises Fe.

8. The semiconductor material layer of claim 1, wherein a donor-like energy level of the deep level transition metal dopant is a dominant energy level of the deep level transition metal dopant.

9. The semiconductor material layer of claim 1, wherein the concentration of the deep level transition metal dopant is greater than about $2 \times 10^{17}$ cm$^{-3}$.

10. The semiconductor material layer of claim 1, wherein the concentration of the deep level transition metal dopant is about $2 \times 10^{16}$ cm$^{-3}$.

11. A semi-insulating semiconductor material layer, comprising a Group III nitride layer including a shallow level dopant having a concentration of less than about $1 \times 10^{17}$ cm$^{-3}$ and a deep level dopant, wherein a concentration of the deep level dopant is greater than the concentration of the shallow level dopant, and wherein the deep level dopant comprises a deep level transition metal dopant, wherein the concentration of the shallow level dopant is greater than a background concentration caused by defects and unintentional impurities in the Group III nitride layer; and wherein the concentration of the deep level transition metal dopant is at least about three times greater than the concentration of the shallow level dopant.

12. The semiconductor material layer of claim 11, wherein the shallow level dopant comprises an n-type dopant.

13. The semiconductor material layer of claim 11, wherein the concentration of the shallow level dopant is a net concentration.

14. The semiconductor material layer of claim 11, wherein the deep level transition metal dopant comprises Fe, Co, Mn, Cr, V and/or Ni.

15. The semiconductor material layer of claim 11, wherein the deep level transition metal dopant comprises Fe.

16. The semiconductor material layer of claim 11, wherein the shallow level dopant comprises an n-type dopant and an acceptor-like energy level of the deep level transition metal dopant is a dominant energy level of the deep level transition metal dopant.

17. The semiconductor material layer of claim 11, wherein the concentration of the deep level transition metal dopant is greater than about $2 \times 10^{17}$ cm$^{-3}$.

18. The semiconductor material layer of claim 11, wherein the concentration of the deep level transition metal dopant is about $2 \times 10^{16}$ cm$^{-3}$.

* * * * *